(12) United States Patent
Weigler et al.

(10) Patent No.: US 7,353,983 B2
(45) Date of Patent: Apr. 8, 2008

(54) VERTICAL REMOVAL OF EXCESS SOLDER FROM A CIRCUIT SUBSTRATE

(75) Inventors: William C. Weigler, New Braunfels, TX (US); Robert Babula, New Braunfels, TX (US); James E. Herbold, Gonzales, TX (US); Thomas P. Gall, Northbrook, IL (US); Steven G. Sharkey, Island Park, IL (US)

(73) Assignee: Temic Automotive of North America, Inc., Deer Park, IL (US)

( * ) Notice: Subject to any disclaimer, the term of this patent is extended or adjusted under 35 U.S.C. 154(b) by 428 days.

(21) Appl. No.: 10/695,187

(22) Filed: Oct. 28, 2003

(65) Prior Publication Data

US 2005/0087588 A1    Apr. 28, 2005

(51) Int. Cl.
*B23K 1/018* (2006.01)

(52) U.S. Cl. ........................ 228/264; 228/119

(58) Field of Classification Search ............ 228/264, 228/246, 191, 119; 29/832, 840, 402.01, 29/825

See application file for complete search history.

(56) References Cited

U.S. PATENT DOCUMENTS

| | | | | |
|---|---|---|---|---|
| 3,580,462 A | * | 5/1971 | Vanyi | 228/51 |
| 3,618,846 A | * | 11/1971 | Poli | 228/52 |
| 3,661,315 A | * | 5/1972 | Helton | 228/20.5 |
| 3,751,799 A | * | 8/1973 | Reynolds | 29/592 |
| 4,877,175 A | * | 10/1989 | Jones et al. | 228/102 |
| 5,143,272 A | * | 9/1992 | Carlomagno et al. | 228/20.5 |
| 5,227,589 A | | 7/1993 | Weeks | |
| 5,242,100 A | | 9/1993 | Weeks | |
| 5,282,565 A | | 2/1994 | Melton | |
| 5,392,980 A | | 2/1995 | Swamy et al. | |
| 5,762,259 A | | 6/1998 | Hubacher et al. | |
| 5,921,462 A | * | 7/1999 | Gordon | 228/191 |
| 5,929,518 A | | 7/1999 | Schlaiss | |
| 5,934,545 A | * | 8/1999 | Gordon | 228/191 |
| 6,156,408 A | | 12/2000 | Zhou et al. | |
| 6,641,865 B2 | * | 11/2003 | Hertz | 427/140 |
| 2003/0019918 A1 | | 1/2003 | Farooq et al. | |

FOREIGN PATENT DOCUMENTS

JP    09260835 A    3/1997

* cited by examiner

*Primary Examiner*—Kevin P. Kerns

(57) ABSTRACT

A method for vertical removal of excess solder from a circuit substrate includes the use of a sacrificial circuit substrate with a plurality of pads and vias that are solder-wettable. The pads and vias of the sacrificial circuit substrate are placed in vertical proximity to the excess solder of the circuit substrate. The excess solder is heated until it is liquid, wherein the excess solder is wicked vertically onto the pads and into the vias of the sacrificial circuit substrate. Thereafter, the sacrificial circuit substrate is lifted from the proximity of the circuit substrate while the solder is in a liquid, taking the excess solder with it but leaving a predetermined amount on the circuit substrate.

14 Claims, 3 Drawing Sheets

VERTICAL REMOVAL OF EXCESS SOLDER FROM A CIRCUIT SUBSTRATE

FIELD OF THE INVENTION

This invention in general relates to printed circuit substrates and, more particularly, to preventing solder defects on reworked printed circuit substrates.

BACKGROUND OF THE INVENTION

Printed circuit substrates are employed in the electronic industry for the placement and interconnection of electronic circuits. Examples of printed circuit substrates in use in the electronic industry include: ceramic substrates, printed circuit boards, flexible printed circuits, porcelain-on-metal substrates, and silicon-on-silicon substrates. These electronic circuits may comprise expensive microprocessor or digital signal processor circuitry in large packages requiring many pinouts to connect to the printed circuit substrate. For example, a ball-grid array (BGA) package may be used for such circuitry. These BGA packages are typically electrically connected to a printed circuit substrate by a surface mounting technique, such as a mass solder reflow operation using hot air or other hot gas such as nitrogen.

The BGA package in particular causes some manufacturing difficulty as the solder connections from the printed circuit substrate to the BGA pinouts are directly beneath the BGA package. Therefore, standard solder wave reflow technique can not be used as the solder can not move beneath the package to make the connections. Moreover, the density of these connections can be quite large results in a very small pitch between connections which can result in solder bridging that electrically shorts connections together. As a result, special assembly techniques must be used that can include solder balls, printed solder paste, or solder bumps pre-placed on the circuit substrate and spaced apart by a solder mask. The BGA package is then placed on the paste, solder bumps or balls, and the assembly is heated using hot air or other hot gas such as nitrogen to melt the solder in order to connect the BGA pinouts to the printed circuit substrate connections. While most BGA attach and repair techniques use hot air to melt the solder, for single sided assemblies, sometimes a hot plate or heated cartridge under the circuit substrate is used to melt the solder. Other means of locally heating the circuit substrate that have been used to locally melt solder include: infrared radiation, soft beam light energy, laser light energy, and applying a hot condensing vapor such as fluorinert (as is used in vapor phase reflow systems).

The problem becomes worse in the removal of defective BGA packages, in that, the removal process typically involves reheating the solder connection and carefully removing the BGA device. If the BGA device is not lifted off the board properly (i.e. a lateral movement occurs) solder bridging can occur requiring further recovery measures or the scrapping of the circuit substrate. In addition, the solder mask used between connections is delicate and flexible and can be damaged if any lateral movement occurs in the removal of the BGA package. If the solder mask is damaged the re-installation of a new BGA device on the reworked circuit substrate can easily result in a new solder bridge, which then requires further rework.

Prior art methods include using a cutting wire to remove the package and the use of high-pressure water jets. However, these mechanical techniques will definitely cause damage to the solder mask. Reflowing the solder to remove the part is least damaging to the solder mask. However, there may be an excessive amount of residual solder left over after the removal of the BGA package, which requires further rework on the circuit substrate, such as using a braided copper solder wick as is known in the art. This further rework can damage the solder mask, also.

Therefore, a need exists for an improved technique for the removal of excess solder, which can result in solder bridges, from a circuit substrate without damage to a solder mask. It would also be desirable to provide such improvement in a simple, single gang operation that limits the potential for damaging lateral movement. It would be of further benefit to use the same equipment for connecting and for disconnecting circuits to the printed circuit substrate, so as to make the removal technique economical and to maintain process control.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

Figure 1:
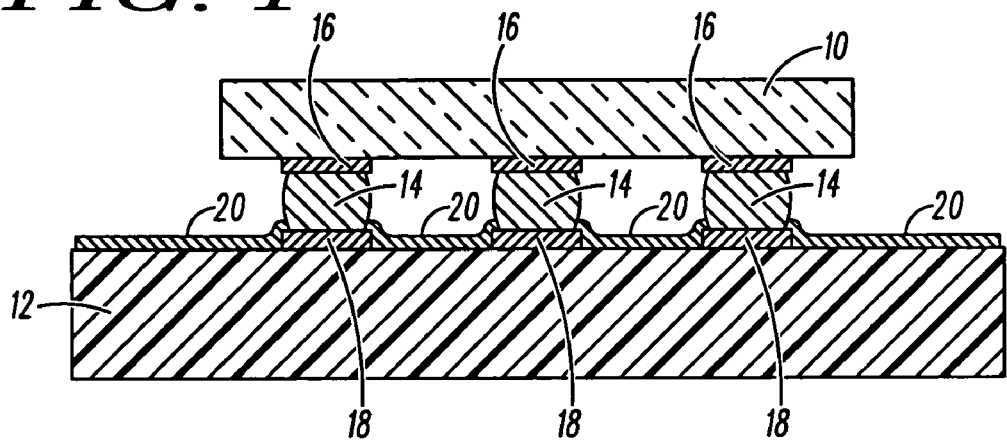
FIG. 1 is a cross-sectional view of a BGA device and printed circuit substrate assembly known in the art.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the broad scope of the invention as defined by the appended claims.

DETAILED DESCRIPTION OF THE PREFERRED EMBODIMENTS

The present invention provides an improved technique for the removal of excessive residual solder from a circuit substrate without damage to a solder mask. The present invention also provides a simple, single gang operation that limits the potential for damaging lateral movement. Moreover, the same equipment for assembly of circuit substrates can be used for disconnecting circuits from the printed circuit substrate, making the present invention economical while maintaining process control.

The present invention can be useful in removing excess solder from the rework site of any fine pitch electronic component, not just Ball Grid Arrays. The present invention could also be used for BGA, Micro BGA, Chip Scale Packages (CSP), and Flip-Chip devices, as well as Fine Pitch Quad Flat Pack (QFP) and Quad Flat No-lead (QFN) packages. The present invention is configured to provide vias to match the footprint of the component that it will be used to rework. Typical BGA pads range from 27 mil diameter down to 19 mil diameter, so the via diameter for the present invention will be approximately 10 mils for these packages. However, the via diameter for this size BGA could range from 10 mils thick up to 60 mils thick. This size would also be typical for a QFP or QFN package. A Micro BGA package can have pads as small as 12 mils, and so a smaller via diameter can be used. The SCS for this size Micro BGA could range from 10 mils thick up to 30 mils thick. For CSP and Flip Chip, the pads are 8 to 15 mils diameter, and the vias could be even smaller ranging from 5 mils thick up to 18 mils thick.

FIG. 1 shows a known assembly of an integrated circuit device 10, such as a ball-grid array (BGA) device, to a printed circuit substrate 12. Solder 14 connects the individual BGA pinouts 16 to respective electrical pads 18 on the printed circuit substrate 12, which have electrical traces (not shown) that run to other circuitry on or off the circuit substrate as is known in the art. A solder mask 20 is present between the electrical pads 18. The solder mask 20 is made of a material that repels molten solder 14, as is known in the art. In this way, the solder mask 20 prevents solder bridging that can short-circuit electrical connections 16, 18, causing an electrical failure of the assembly requiring a rework of the assembly and hopefully the recover of the BGA device 10, printed circuit substrate 12, or both. However, it should be recognized that other common types of circuit failure can also require a rework of the assembly. For Flexible circuit substrate 12 the solder mask 20 must also be flexible, making the solder mask 20 prone to damage during rework procedures.

Figure 2:
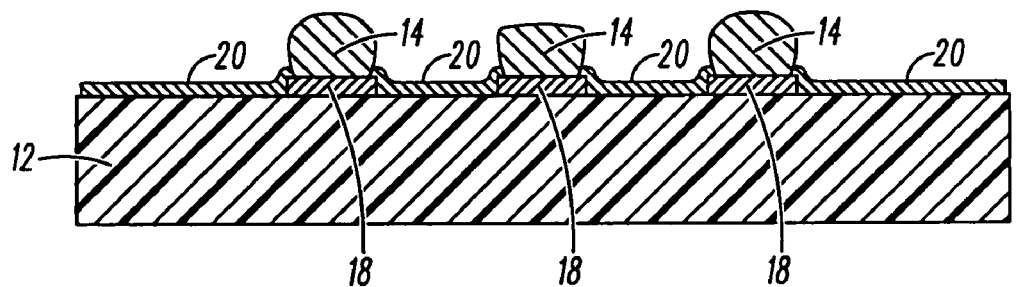
FIG. 2 is a cross-sectional view of the printed circuit substrate of FIG. 1 after a typical solder reflow removal of the BGA device.
Figure 3:
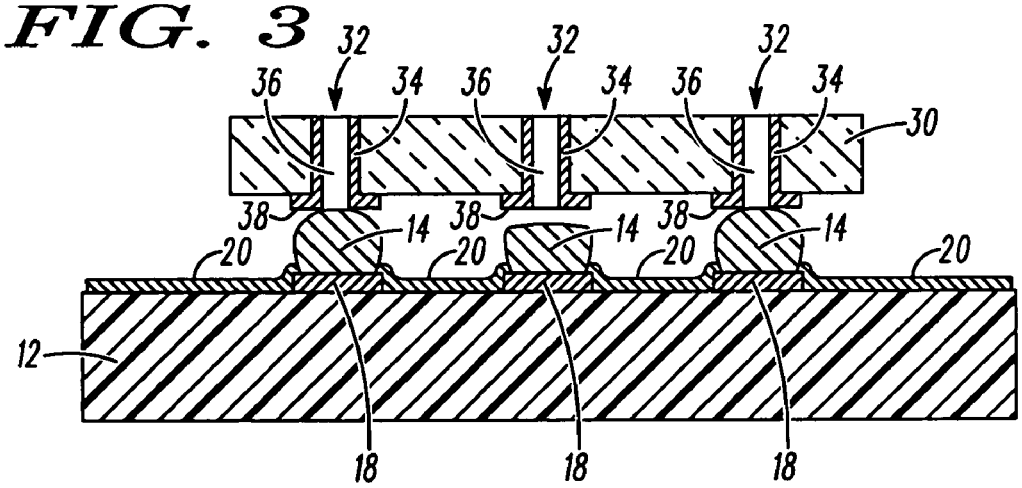
FIG. 3 is a cross-sectional view of a sacrificial circuit substrate placed in proximity to the excessive solder of the printed circuit substrate of FIG. 2, in accordance with the present invention.
Figure 4:
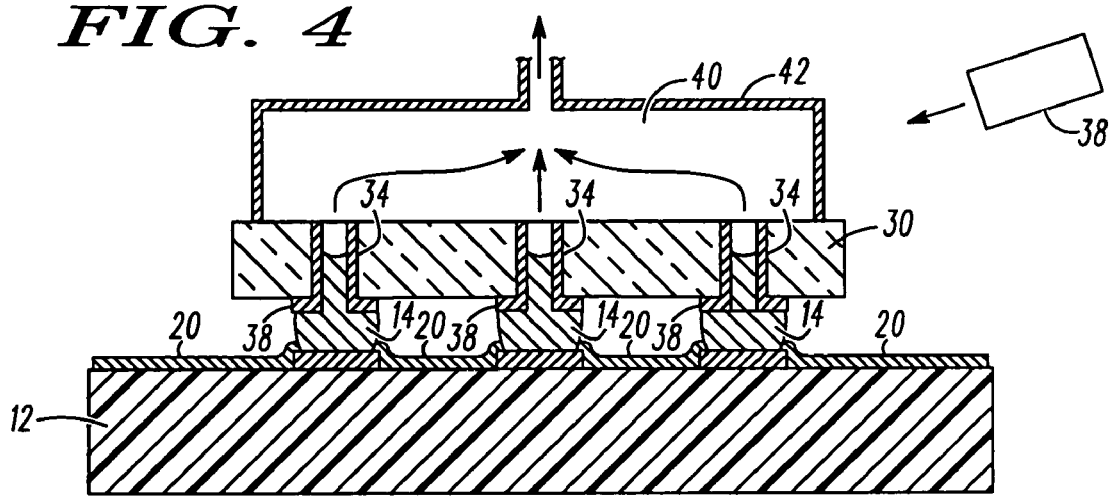
FIG. 4 is a cross-sectional view of the operation of the sacrificial circuit Substrate on the reflowed assembly of FIG. 3, in accordance with the present invention.
Figure 5:
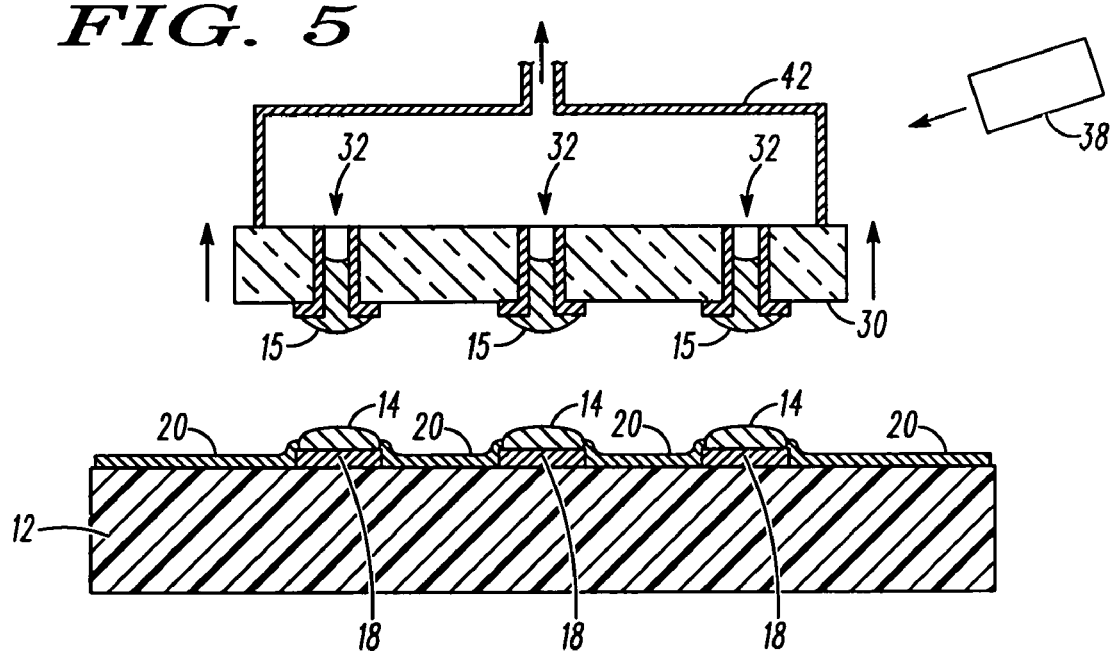
FIG. 5 is a cross-sectional view of the printed circuit substrate of FIG. 4 after removal of the sacrificial circuit substrate, in accordance with the present invention.

FIG. 2 shows a typical printed circuit substrate 12 after removal of the BGA device. Typically, when a BGA device is soldered to a circuit substrate, over 90% of the solder is supplied by the BGA device and less than 10% from deposited solder paste on the circuit substrate. As can be seen, excessive solder 14 may exist at several locations on the printed circuit substrate 12 after removal of a device. The amount of excessive solder is inconsistent but is generally about 50% of the original amount, where only 10% is needed for reworking purposes. The excess solder at each location will be of varying amounts. Although it is desirable in the re-assembly of components to have some solder left on the electrical connections of the printed circuit substrate, it is not desirable to have excessive solder as this may cause solder bridges as explained previously. FIGS. 3-5 demonstrate a system for the vertical removal of excess solder from a circuit substrate to protect the solder mask, in accordance with the present invention.

FIG. 3 shows a sacrificial circuit substrate 30 (SCS) placed in proximity to the excessive solder 14 of the printed circuit substrate 12 in preparation for the removal of the excess solder 14. The sacrificial circuit substrate 30 includes a plurality of metallic pads 38. Preferably, the sacrificial circuit substrate 30 also includes a plurality of vias 32 connected to the pads 38. The vias can be of various shapes but are preferably cylindrical. Generally, the circuit substrate is made of a thin flexible material such as FR4, which is known in the art. The sacrificial circuit substrate 30 can also be made of a thin flexible material such as FR4, to be conformant with the circuit substrate 12. However, it is preferred that the sacrificial circuit substrate 30 be provided in a rigid substrate such as a resin-impregnated glass weave as is known in the art and which is much cheaper than flexible FR4. Typically, the vias 32 are through-holes formed through the board 30 and arranged in a pattern matching that of the pinout of the device that was removed. For example, a BGA package has regularly spaced pinouts in an array formation corresponding to the locations of the pads 18 of the circuit substrate 12. The pads 38 and vias 32 of the sacrificial circuit substrate 30 would be similarly arranged in an array to align with the plurality of excess solder 14 bumps on the circuit substrate 12.

A portion of each pad 38 and via 32 has a solder-wettable material 34 disposed thereon. Typically copper or copper alloy is used for the solder-wettable material 34. Preferably, the pads 38 and vias 32 are gold plated to maintain the integrity of the solder wettable properties. However, other solder-wettable materials and alloys can be used equally well. The vias 32 of the sacrificial circuit substrate 30 includes through-holes 34 that are plated with a solder-wettable material. The pads 38, and optional vias 32 and through-holes 34 are configured to provide a desired amount of excess solder wicking, as will be detailed below.

Due to the uneven nature of the excess solder bumps 14, the pads 38 of the sacrificial board 30 will not all be in contact with the excess solder bumps. However, once reflowed, contact will be made with all the excess solder bumps 14. Moreover, the alignment of the placement of the sacrificial circuit substrate 30 over the circuit substrate 12 is not critical as the surface tension of the reflowed solder bumps will serve to align the two as shown in FIG. 4.

FIG. 4 shows the operation of the sacrificial circuit substrate on the reflowed assembly. Specifically, the plurality of pads 38 and vias 32 of the sacrificial circuit substrate 30 are to be located in vertical proximity to the excess solder 14 of the circuit substrate 12 so as to wick the excess solder vertically onto the pads 38 and vias 32, and subsequently into the through-holes 36 of the vias 32 of the sacrificial circuit substrate 30. A heat source 38 is provided for heating the excess solder to a liquidous state. Preferably, the heat source is a hot gas source, such as air or nitrogen, to reflow the excess solder. Reflowed solder 14 will adhere to the solder-wettable surface 34 of the pads 38 and vias 32, and surface tension will draw the excess solder 14 into the vias 32 by a capillary (wicking) action. The dimensions of the vias, through-holes and pads are chosen, given the material of the solder-wettable surface 34, along with the amount and time of heat applied, in order to remove most of the excess solder but leaving a predetermined amount on the pads 18 of the circuit 12 to allow the attachment of a new part (e.g. BGA device).

In a preferred embodiment, a flux is applied to the pads and vias of the sacrificial circuit substrate to assist in the wettability of the solder-wettable material. More preferably, a vacuum source 40 is applied to further assist in the wicking of the excess solder. The vacuum can be applied by means of a vacuum housing 42 that covers the vias, or can be applied through other suitable means to provide a vacuum to each via. The vacuum source 42 is applied to the via through-holes opposite the excess solder liquid to assist wicking of the solder into the vias. The amount of vacuum used can control the residual amount of solder remaining on the circuit substrate after the wicking of the excess solder into the vias. Vacuum can be applied such that solder can extend partially into the through-holes, completely into the through-holes, or even extending beyond the top end of the through-holes.

FIG. 5 shows the printed circuit substrate 12 after vertical removal of the sacrificial circuit substrate 14. Vertical removal can be done with or without the vacuum applied (as shown), but the solder must be in a liquid state. The pads 38 and vias 32 retain the excess solder 15, wherein a predetermined amount of residual solder 14 is left after the removal process. For Flexible circuit substrate, the solder mask is very susceptible to damage. Therefore, the sacrificial circuit substrate 14 is lifted vertically in order to prevent damage to the solder mask, which facilitates the proper assembly of a new device to the circuit substrate without danger of solder bridge formation, and retains the proper amount of residual solder 14 on the pads 18 of the circuit substrate 12. Moreover, this vertical removal reduces that possibility of contamination of the circuit substrate. After removal, sacrificial circuit substrate can be reworked for further use. However, it is more economical to dispose of the sacrificial board.

Figure 6:
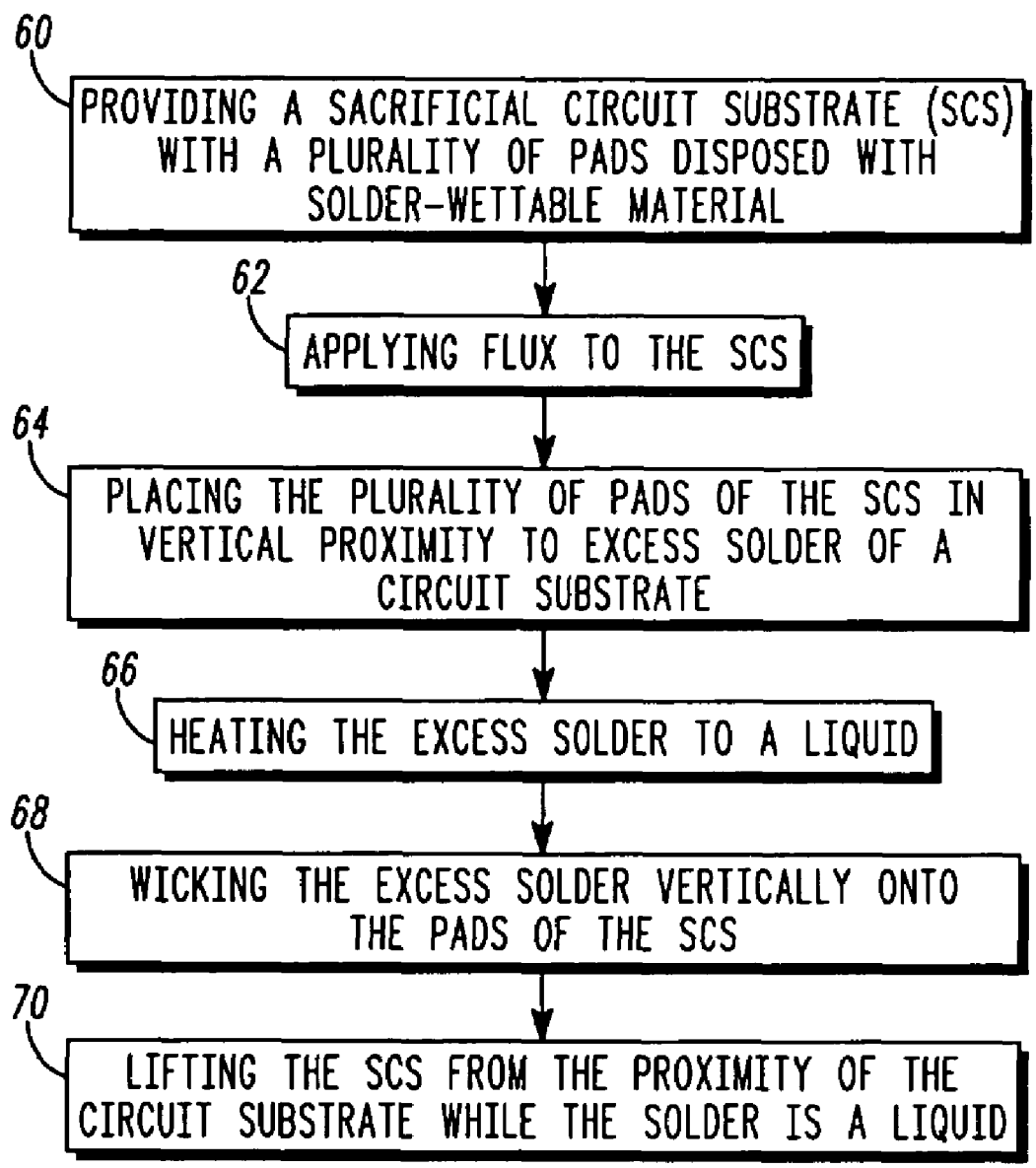
FIG. 6 is a flow chart of a method, in accordance with the present invention.

The present invention also encompasses a method for vertical removal of excess solder from a circuit substrate. Referring to FIG. 6, the method includes a first step 60 of providing a sacrificial circuit substrate with a plurality of pads and optionally vias. Preferably, the circuit substrate is a flexible circuit board and the sacrificial circuit substrate is a rigid circuit board. However, the sacrificial circuit substrate can also be flexible or rigid. A portion of each pad and via has a solder-wettable material disposed thereon. In particular, this step 60 includes providing the pads connected to the vias with through-holes that are plated with a solder-wettable material.

Preferably, a next step 62 includes applying flux to the sacrificial circuit substrate, or to the site to be reworked.

A next step 64 includes placing the plurality of pads and vias of the sacrificial circuit substrate in vertical proximity to the excess solder of the circuit substrate.

A next step 66 includes heating the excess solder to a liquidous state. Preferably, includes using hot air or other hot gas such as nitrogen to reflow the excess solder. A solder reflow temperature profile similar to one used for BGA removal is run to cause the excess solder to become liquidous and to wet the pads and vias of the sacrificial circuit substrate.

A next step 68 includes wicking the excess solder vertically onto the pads and into the optional vias of the sacrificial circuit substrate. Preferably, this step includes applying a vacuum to the vias to assist wicking of the solder into the through-holes of the vias, but can be done without vacuum through capillary action of the solder in the vias.

A next step 70 includes vertically lifting the sacrificial circuit substrate from the proximity of the circuit substrate while the solder is in a liquidous state. The vacuum from the previous step 68 can be used for this purpose. For example, while the solder is in a liquid state, the sacrificial circuit substrate is lifted using the vacuum function. The lifting is done vertically to prevent damage to the solder mask of the circuit substrate. In practice, the dimensions of the pads, vias and through-holes of the providing step 60 are configured to leave a desired residual amount of solder on the circuit substrate after the wicking 68 and lifting 70 steps.

The above description of the present invention is intended to be exemplary only and is not intended to limit the scope of any patent issuing from this application. The present invention is intended to be limited only by the broad scope of the following claims.

What is claimed is:

1. A method for vertical removal of excess solder from a circuit substrate, the method comprising the steps of:
   providing a sacrificial circuit substrate with a plurality of pads, a portion of each pad having a solder-wettable material disposed thereon and wherein the plurality of pads are connected to vias comprising through-holes that are plated with a solder-wettable material;
   placing the plurality of pads of the sacrificial circuit substrate in vertical proximity to the excess solder of the circuit substrate;
   heating the excess solder to a liquidous state;
   wicking the excess solder vertically onto the pads of the sacrificial circuit substrate by capillary action; and
   lifting the sacrificial circuit substrate from the proximity of the circuit substrate while the solder is in a liquidous state.

2. The method of claim 1, wherein the circuit substrate is flexible and wherein the providing step includes providing a rigid sacrificial circuit substrate.

3. The method of claim 1, wherein the heating step includes using hot gas to reflow the excess solder.

4. The method of claim 1, wherein the providing step include providing solder-wettable vias connected to the pads, the vias including through-holes that are plated with a solder-wettable material.

5. The method of claim 1, wherein the wicking step includes wicking of the solder into the through-holes of the vias.

6. The method of claim 1, wherein the dimensions of the pads, vias and through-holes are configured to leave a residual amount of solder on the circuit substrate after the wicking and lifting steps.

7. The method of claim 1, wherein the wicking step further comprises applying a vacuum to the vias to assist wicking of the solder into the vias.

8. The method of claim 1, further comprising the step of applying flux to the sacrificial circuit substrate.

9. A method for vertical removal of excess solder from a ball-grid array portion of a circuit substrate having a solder mask disposed thereon, the method comprising the steps of:
   providing a rigid sacrificial circuit substrate with a plurality of vias arranged in an array pattern matching that of the ball-grid array portion of the circuit substrate, the vias having solder-wettable through-holes;
   placing the plurality of vias of the sacrificial circuit substrate in vertical proximity to the excess solder of the ball-grid array portion of the circuit substrate;
   heating the excess solder to a liquidous state;
   wicking the excess solder vertically into the vias of the sacrificial circuit substrate by capillary action; and
   lifting the sacrificial circuit substrate from the proximity of the circuit substrate while the solder is in a liquidous state to prevent lateral movement across the solder mask.

10. The method of claim 9, wherein the heating step includes using hot gas to reflow the excess solder.

11. The method of claim 9, wherein the providing step includes providing the vias with solder-wettable pads connected to the solder-wettable material of the through-holes.

12. The method of claim 9, wherein the wicking step includes applying a vacuum to the vias to assist wicking of the solder into the vias and leaving a residual solder amount on the ball-grid array portion of the circuit substrate sufficient to solder a ball-grid array package thereon.

13. The method of claim 12, wherein the providing step includes providing the vias with solder-wettable pads connected to the through-holes, and wherein the pads and the through-holes are configured to leave a predetermined amount of solder on the circuit substrate after the wicking and lifting steps.

14. The method of claim 9, further comprising the step of applying flux to the sacrificial circuit substrate.

* * * * *